(12) United States Patent
Yan et al.

(10) Patent No.: US 10,283,485 B2
(45) Date of Patent: May 7, 2019

(54) SEMICONDUCTOR DEVICE INCLUDING CONDUCTIVE BUMP INTERCONNECTIONS

(71) Applicant: SANDISK SEMICONDUCTOR (SHANGHAI) CO., LTD., Shanghai (CN)

(72) Inventors: Junrong Yan, Shanghai (CN); Xiaofeng Di, Shanghai (CN); Chee Keong Chin, Shanghai (CN); Kim Lee Bock, Shanghai (CN); Mingxia Wu, Shanghai (CN)

(73) Assignee: SanDisk Semiconductor (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 15/617,867

(22) Filed: Jun. 8, 2017

(65) Prior Publication Data
US 2018/0337161 A1 Nov. 22, 2018

(30) Foreign Application Priority Data

May 16, 2017 (CN) .......................... 2017 1 0343078

(51) Int. Cl.
*H01L 25/065* (2006.01)
*H01L 23/00* (2006.01)
*H01L 25/00* (2006.01)
*H01L 21/56* (2006.01)
*H01L 21/78* (2006.01)
*H01L 21/304* (2006.01)
(Continued)

(52) U.S. Cl.
CPC ........ *H01L 25/0657* (2013.01); *H01L 21/288* (2013.01); *H01L 21/304* (2013.01); *H01L 21/56* (2013.01); *H01L 21/78* (2013.01); *H01L 22/12* (2013.01); *H01L 24/06* (2013.01); *H01L 24/11* (2013.01); *H01L 24/16* (2013.01); *H01L 24/48* (2013.01); *H01L 25/50* (2013.01); *H01L 24/17* (2013.01); *H01L 24/43* (2013.01); *H01L 2224/0401* (2013.01); *H01L 2224/04042* (2013.01); *H01L 2224/06179* (2013.01); *H01L 2224/1134* (2013.01); *H01L 2224/13147* (2013.01); *H01L 2224/16013* (2013.01); *H01L 2224/16014* (2013.01); *H01L 2224/16113* (2013.01); *H01L 2224/16145* (2013.01); *H01L 2224/16227* (2013.01); *H01L 2224/17179* (2013.01); *H01L 2224/48145* (2013.01); *H01L 2224/48463* (2013.01); *H01L 2225/0651* (2013.01); *H01L 2225/06506* (2013.01); *H01L 2225/06513* (2013.01); *H01L 2225/06517* (2013.01); *H01L 2225/06562* (2013.01); *H01L 2225/06586* (2013.01); *H01L 2924/1438* (2013.01); *H01L 2924/20104* (2013.01)

(58) Field of Classification Search
None
See application file for complete search history.

(56) References Cited

U.S. PATENT DOCUMENTS 6,188,127 B1 2/2001 Senba et al.
6,774,473 B1 8/2004 Shen
(Continued)

*Primary Examiner* — Long Pham
(74) *Attorney, Agent, or Firm* — Vierra Magen Marcus LLP

(57) ABSTRACT

A semiconductor device is disclosed including semiconductor die stacked in a stepped, offset configuration, where die bond pads of semiconductor die on different levels are interconnected using one or more conductive bumps.

22 Claims, 6 Drawing Sheets

(51) Int. Cl.
*H01L 21/288* (2006.01)
*H01L 21/66* (2006.01)

(56) References Cited

U.S. PATENT DOCUMENTS

| | | |
|---|---|---|
| 7,064,434 B2 | 6/2006 | Lam et al. |
| 8,546,195 B2 | 10/2013 | Do et al. |
| 9,508,689 B2 | 11/2016 | Co et al. |
| 2003/0006494 A1 | 1/2003 | Lee et al. |
| 2008/0023814 A1 | 1/2008 | Yang |
| 2008/0191367 A1 | 8/2008 | Kim |
| 2009/0068790 A1* | 3/2009 | Caskey .................. H01L 24/24 438/109 |
| 2009/0325344 A1 | 12/2009 | Takiar et al. |
| 2010/0187690 A1* | 7/2010 | Okada .................... H01L 24/45 257/738 |
| 2015/0031149 A1* | 1/2015 | Han ....................... H01L 24/85 438/17 |

* cited by examiner

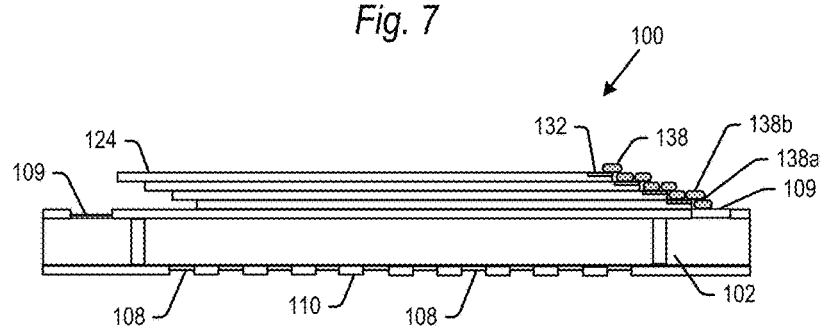
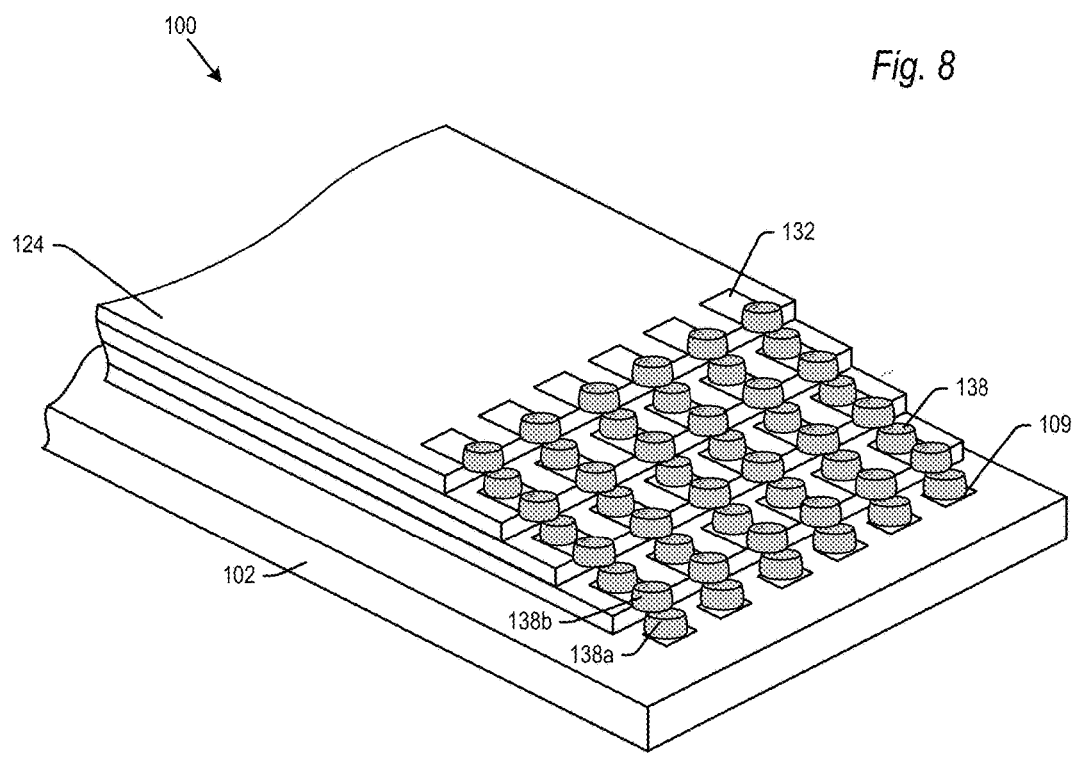

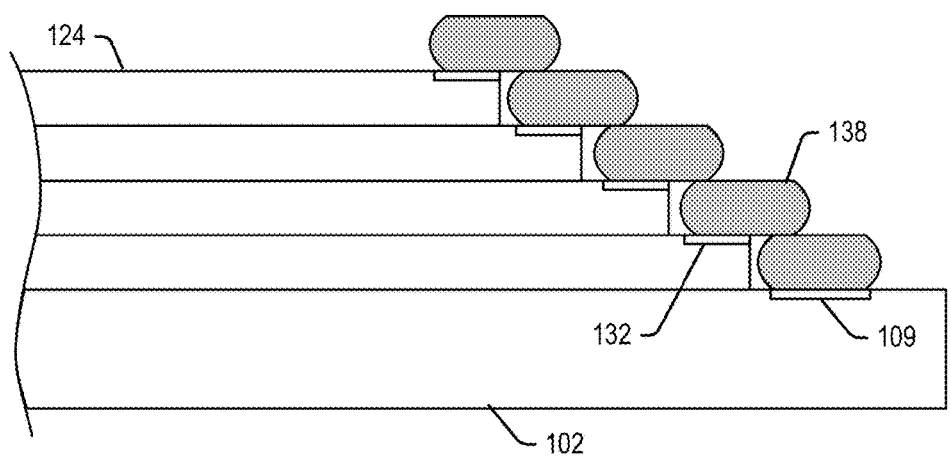
*Fig. 9*
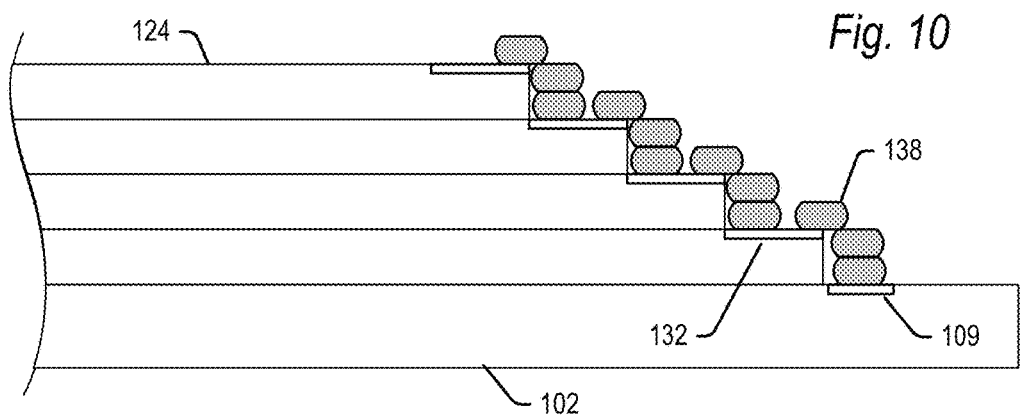
*Fig. 10*
*Fig. 11*
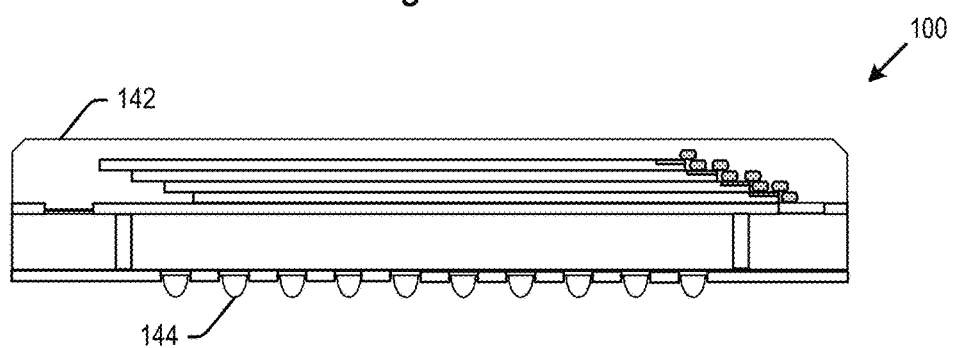

SEMICONDUCTOR DEVICE INCLUDING CONDUCTIVE BUMP INTERCONNECTIONS

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound which provides a protective package.

In order to most efficiently use package footprint, it is known to stack semiconductor die on top of each other. In order to provide access to bond pads on the semiconductor die, the die are stacked, either completely overlapping each other with a spacer layer in between adjacent die, or with an offset. In an offset configuration, a die is stacked on top of another die so that the bond pads of the lower die are left exposed.

Using wire bonds to interconnect semiconductor die in the die stack has some disadvantages. These disadvantages include wire sweep, where the spacing between bonds wires changes, for example during handling or mold encapsulation. Wire sweep can change the mutual inductance of adjacent wires and can also result in electrical short. A further disadvantage is that the height of the uppermost bond wires in a semiconductor package can increase the overall height of the package.

DESCRIPTION OF THE DRAWINGS

FIG. 7 is a side view of a semiconductor device at a fifth step in the fabrication process according to an embodiment of the present technology.

FIG. 8 is a simplified perspective view of a semiconductor device at the fifth step in the fabrication process where the semiconductor die in the die stack are electrically interconnected with conductive bumps according to an embodiment of the present technology.

FIG. 9 is a side view of a semiconductor device where the semiconductor die in the die stack are electrically interconnected with conductive bumps according to an alternative embodiment of the present technology.

FIG. 10 is a side view of a semiconductor device where the semiconductor die in the die stack are electrically interconnected with conductive bumps according to a further alternative embodiment of the present technology.

FIG. 11 is a side view of a completed semiconductor device according to an embodiment of the present technology.

DETAILED DESCRIPTION

The present technology will now be described with reference to the figures, which in embodiments, relate to a semiconductor device including semiconductor die stacked in a stepped, offset configuration, where die bond pads of semiconductor die on different levels are interconnected using one or more conductive bumps. The number of conductive bumps used may depend on a height of the bumps applied and a height of the semiconductor die in the die stack. Conductive bumps are stacked on top of each other to match or nearly match the height of a semiconductor die. An upper conductive bump is then applied partially on the bump stack and partially on the die bond pads of the next upper semiconductor die.

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the technology as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal" as may be used herein are by way of example and illustrative purposes only, and are not meant to limit the description of the technology inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±0.25%.

An embodiment of the present technology will now be explained with reference to the flowchart of FIG. 1 and the top, side and perspective views of FIGS. 2 through 13. Although FIGS. 2 through 13 each show an individual semiconductor device 100, or a portion thereof, it is understood that the device 100 may be batch processed along with a plurality of other packages on substrate panels to achieve economies of scale. The number of rows and columns of devices 100 on the substrate panels may vary.

Figure 2:
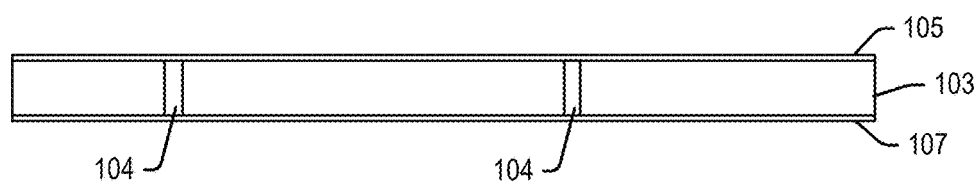
FIG. 2 is a side view of a semiconductor device at a first step in the fabrication process according to an embodiment of the present technology.

The substrate panel for the fabrication of semiconductor device 100 begins with a plurality of substrates 102 (again, one such substrate is shown in FIGS. 2 through 13). The substrate 102 may be a variety of different chip carrier mediums, including a printed circuit board (PCB), a leadframe or a tape automated bonded (TAB) tape. Where substrate 102 is a PCB, the substrate may be formed of a core 103 having a top conductive layer 105 and a bottom conductive layer 107 as shown in FIG. 2. The core 103 may be formed of various dielectric materials such as for example, polyimide laminates, epoxy resins including FR4 and FR5, bismaleimide triazine (BT), and the like. The core may have a thickness of between 40 microns (μm) to 200 μm, although the thickness of the core may vary outside of that range in alternative embodiments. The core 103 may be ceramic or organic in alternative embodiments.

The conductive layers 105, 107 surrounding the core may be formed of copper or copper alloys, plated copper or plated copper alloys, Alloy 42 (42Fe/58Ni), copper plated steel, or other metals and materials suitable for use on substrate panels. The conductive layers may have a thickness of about 10 μm to 25 μm, although the thickness of the layers may vary outside of that range in alternative embodiments.

Figure 1:
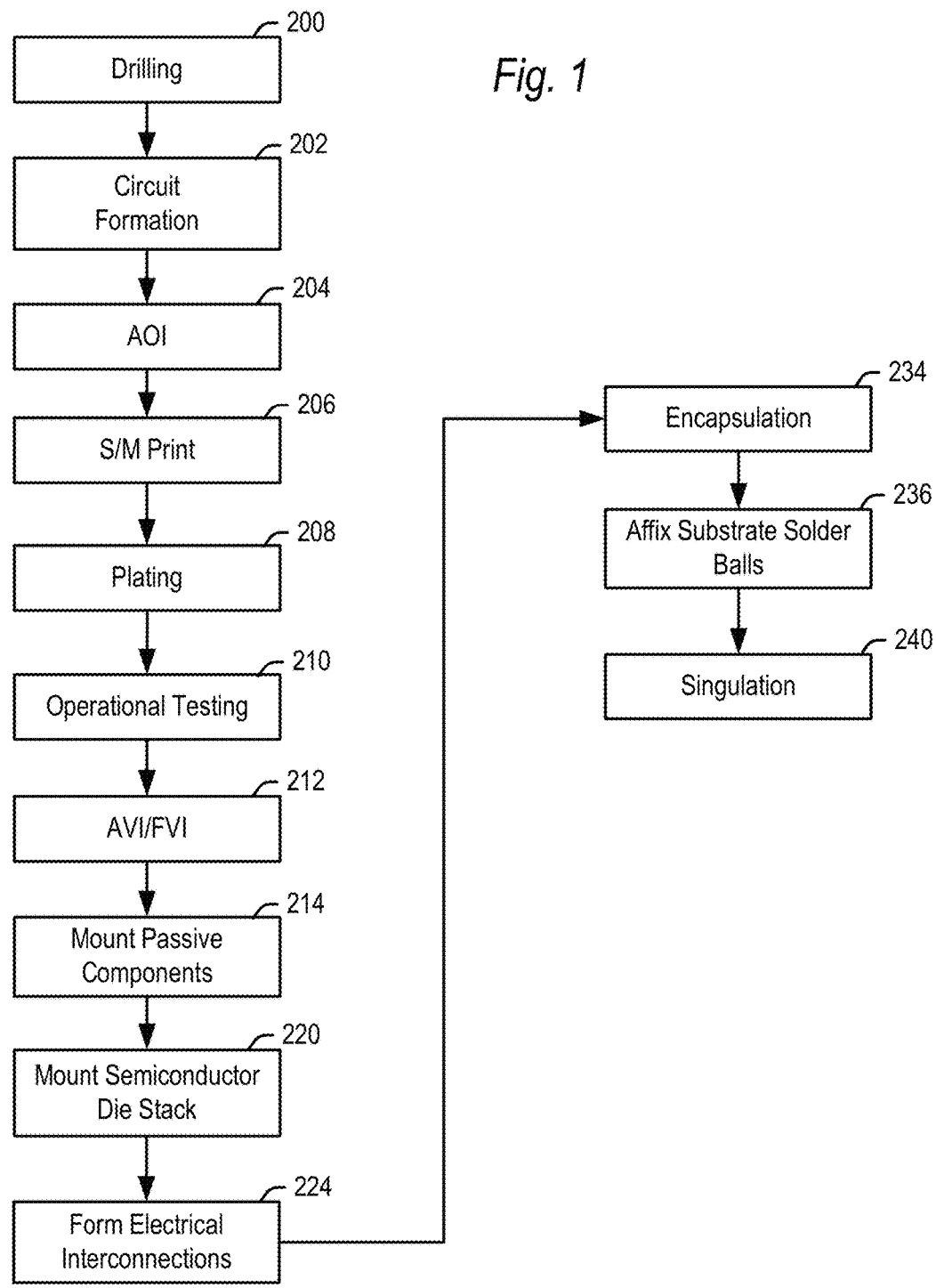
FIG. 1 is a flowchart of the overall fabrication process of semiconductor device according to embodiments of the present technology.
Figure 3:
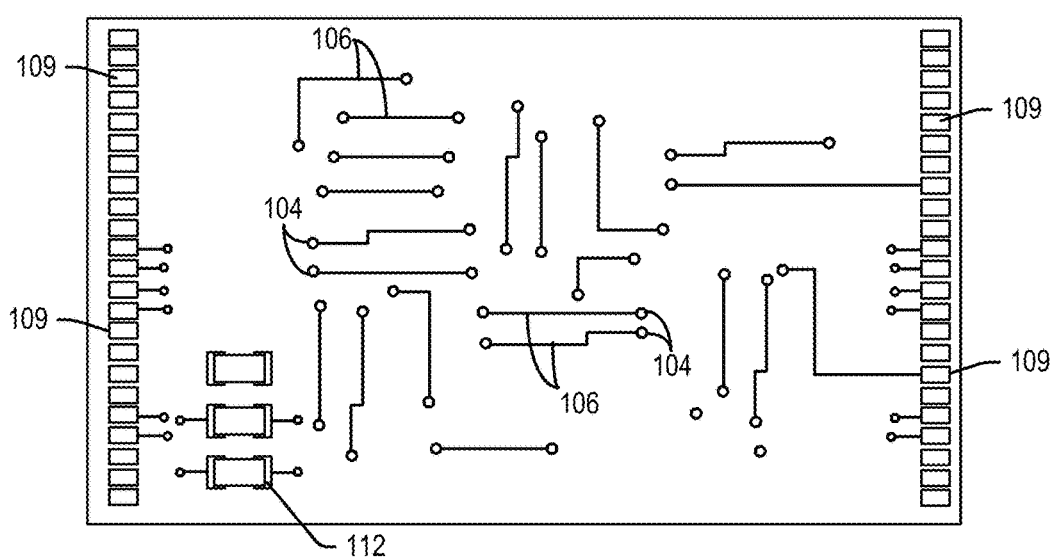
FIG. 3 is a top view of a semiconductor device at a second step in the fabrication process according to an embodiment of the present technology.
Figure 4:
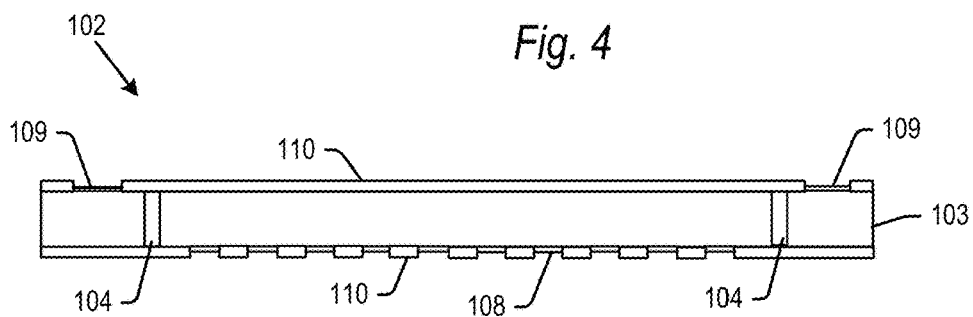
FIG. 4 is a side view of a semiconductor device at a third step in the fabrication process according to an embodiment of the present technology.

FIG. 1 is a flowchart of the fabrication process for forming a semiconductor device 180 according to embodiments of the present technology. In a step 200, the substrate 102 of a first semiconductor device 100 may be drilled to define through-hole vias 104 in the substrate 102. The vias 104 shown are by way of example, and the substrate 102 may include many more vias 104 than are shown in the figures, and they may be in different locations than are shown in the figures. Conductance patterns are next formed on one or both of the top and bottom conductive layers in step 202. The conductance pattern(s) may include electrical traces 106, contact pads 109 on a top surface of the substrate and contact pads 108 on a bottom surface of the substrate as shown for example in FIGS. 3 and 4. The traces 106 and contact pads 109, 108 (only some of which are numbered in the figures) are by way of example, and the substrate 102 may include more traces and/or contact pads than is shown in the figures, and they may be in different locations than is shown in the figures. In one embodiment, the substrate 102 may include one or more rows of contact pads 109 at opposed edges of the substrate 102 as shown in FIG. 3. In further embodiments, contact pads 109 may be provided along a single edge, three edges or all four edges of the substrate. Further embodiments may employ a multi-layer substrate, which include internal conductance patterns in addition to those on the top and/or bottom surfaces.

In various embodiments, the finished semiconductor device may be used as a BGA (ball grid array) package. A lower surface of the substrate 102 may include contact pads 108 for receiving solder balls as explained below. In various embodiments, the finished semiconductor device 180 may be an LGA (land grid array) package including contact fingers for removably coupling the finished device 180 within a host device. In such embodiments, the lower surface may include contact fingers instead of the contact pads that receive solder balls. The conductance pattern on the top and/or bottom surfaces of the substrate 102 may be formed by a variety of suitable processes, including for example various photolithographic processes.

Referring again to FIG. 1, the substrate 102 may next be inspected in step 204. This step may include an automatic optical inspection (AOI). Once inspected, a solder mask 110 (FIG. 4) may be applied to the substrate in step 206. After the solder mask is applied, the contact pads, and any other areas to be soldered on the conductance patterns may be plated, for example, with a Ni/Au, Alloy 42, or the like, in step 208 in a known electroplating or thin film deposition process. The substrate 102 may then undergo operational testing in step 210. In step 212, the substrate may be visually inspected, including for example an automated visual inspection (AVI) and a final visual inspection (FVI) to check for contamination, scratches and discoloration. One or more of these steps may be omitted or performed in a different order.

Assuming the substrate 102 passes inspection, passive components 112 (FIG. 3) may next be affixed to the substrate 102 in a step 214. The one or more passive components may include for example one or more capacitors, resistors and/or inductors, though other components are contemplated. The passive components 112 shown are by way of example only, and the number, type and position may vary in further embodiments.

Figure 5:
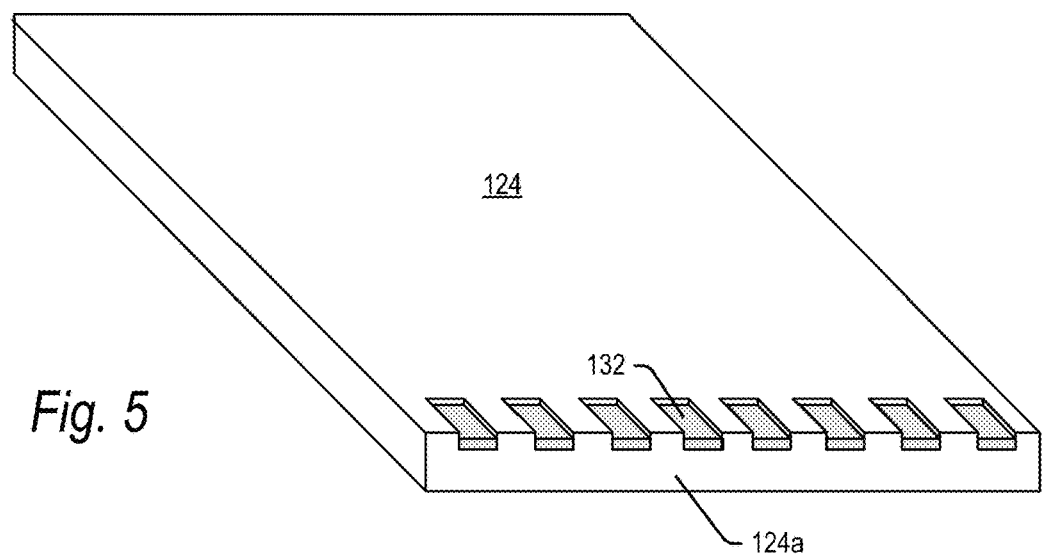
FIG. 5 is a perspective view of a semiconductor die used in the semiconductor device of the present technology.

In step 220, a number of semiconductor die may next be stacked on the substrate 102. FIG. 5 illustrates an example of a semiconductor die 124 which may be used. The semiconductor die 124 may for example be memory die such a NAND flash memory die, but other types of die 124 may be used. These other types of semiconductor die include but are not limited to controller die such as an ASIC, or RAM such as an SDRAM. The semiconductor die 124 may further alternatively be used to form device 100 into a power semiconductor device such as for example a switch or rectifier.

Each semiconductor die 124 may include a number of die bond pads 132 formed so as to terminate at an edge 124a of the semiconductor die 124. In particular, when still part of a semiconductor wafer from which semiconductor die 124 is diced, the wafer scribe lines may be defined so as to intersect the die bond pads 132 defined on the surface of the wafer for each semiconductor die. When the wafer is diced along the scribe lines, the cut is made through the die bond pads on each semiconductor die, resulting in the die bond pads 132 terminating at the edge of the semiconductor die 124. In embodiments, each die bond pad 132 may have a length and width of approximately 70 μm, though the length and width may vary in further embodiments, proportionately or disproportionately to each other. There may be more die bond pads 132 than are shown in FIG. 5, and the die bond pads may be formed along more than one edge of the semiconductor die 124 in further embodiments.

Figure 6:
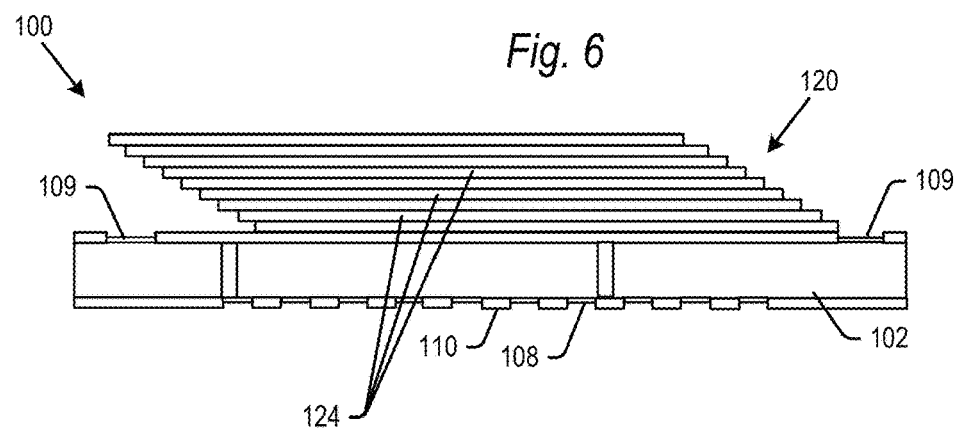
FIG. 6 is a side view of a semiconductor device at a fourth step in the fabrication process according to an embodiment of the present technology.

The semiconductor die 124 may be diced from the wafer for example by stealth dicing before grinding. In this technology, a laser makes pinpoint holes beneath the surface of the wafer, which holes result in cracks which propagate to the upper and lower surfaces of the wafer, for example during the wafer backgrind step, for precise dicing of the wafer. It is understood that the wafer may be diced to produce semiconductor die 124 by methods other than stealth dicing before grinding in further embodiments, including for example by saw, laser or waterjet cutting methods.

Where multiple semiconductor die 124 are included, the semiconductor die 124 may be stacked atop each other in an offset stepped configuration to form a die stack 120 as shown in FIG. 6. The number of die 124 in stack 120 in FIGS. 6-12 is by way of example only, and embodiments may include different numbers of semiconductor die in stack 120, including for example 1, 2, 4, 8, 16, 32 or 64 die. There may be other numbers of die in further embodiments. There may be more than one die stack 120, with alternating stacks stepped in opposite directions. In such an embodiment, an interposer layer (not shown) may be provided between the stacks to electrically connect the die bond pads of adjacent die stacks. The die may be affixed to the substrate and/or each other using a die attach film. As one example, the die attach film may be EM760L2-P from Nitto Denko having headquarters in Japan, cured to a B-stage to preliminarily affix the die 124 in the stack 120, and subsequently cured to a final C-stage to permanently affix the die 124 in the stack 120.

In step 224, the semiconductor die in the die stack 120 may be electrically connected to each other and to the substrate 102. In accordance with aspects of the present technology, conductive bumps may be used to electrically interconnect die bond pads on each level of the semiconductor die 124 in stack 120. This feature of the present technology will now be explained in greater detail with respect to FIGS. 7-10.

In general, the conductive bumps 138 may be deposited on the substrate contact pads 109 and the die bond pads 132 of the die 124 to electrically connect respective columns of vertically aligned contact pads/die bond pads up the die stack. For example, in FIG. 8, the conductive bumps 138 electrically interconnect the leftmost contact pad 109 and the leftmost die bond pads 132 of each die 124 in stack 120. The conductive bumps 138 electrically interconnect the second leftmost contact pad 109 and the second leftmost die bond pads 132 of each die 124 in stack 120. And so on across the contact pads 109, die bond pads 132.

The conductive bumps 138 may be formed by different technologies, but in one example, the conductive bumps may be formed for example by stud bumping, where the bumps are formed and deposited by a wire bond capillary (not shown) otherwise used to form wire bonds. In such embodiments, starting at the lowermost position (on contact pad 109 of substrate 102), a first conductive bump may be deposited by forming a molten ball at the tip of a wire within the wire bond capillary by electronic flame off (EFO). The molten ball may then be pressed onto the contact pad 109 using an elevated temperature and ultrasonic oscillation and left behind to form a conductive bump 138. In one embodiment, the conductive bumps 138 may be formed under a pressure of 20 g at a temperature of 145° C. for about 12 ms using an ultrasonic frequency of 120 KHz. These parameters are by way of example only, and each may vary in further embodiments. Once a conductive bump 138 is affixed, the wire bond capillary may pull away to break the wire and leave the conductive bump 138 in place.

After a first conductive bump 138 is formed on the contact pad 109, the wire bond capillary may proceed to form similar conductive bumps horizontally on the remaining contact pads 109. And thereafter, horizontal rows of conductive bumps be built thereon, one row at a time, up the die stack. Alternatively, from the initial conductive bump, additional conductive bumps 138 may be built vertically up the die stack. And thereafter, additional vertical columns of conductive bumps may be built, one column at a time, across the die stack. Conductive bumps 138 may be formed on the contact pads 109 and die bond pads 132 in other orders in further embodiments.

Referring now specifically to FIGS. 7 and 8, conductive bumps 138 may be applied to a contact pad 109 and die bond pads 132 to build a vertical column of conductive bumps which electrically interconnect the semiconductor die 124 in stack 120 with each other and the substrate 102. The number of conductive bumps 138 needed depends on the height of the conductive bumps 138 and the height of the semiconductor die 124 in the stack 120. FIGS. 7 and 8 show an example where the height of a conductive bump 138 is at least approximately the same height as the semiconductor die 124 (including DAF layer) in the die stack. In one embodiment, this may be 20 µm to 35 µm, and more particularly about 25 µm, though the height of the semiconductor die 124 and/or conductive bumps 138 may be higher or lower than this in further embodiments.

Where the height of a conductive bump 138 is at least approximately the same height as the semiconductor die 124 in the die stack, a single conductive bump, referred to herein as the base conductive bump 138a, may first be applied to the contact pad 109. At that point, the upper surface of the base conductive bump 138a is at least approximately level with the die bond pad 132 on the first semiconductor die 124. The wire bond capillary may then shift toward the first semiconductor die 124 and deposit another conductive bump 138, referred to herein as the offset interconnecting conductive bump 138b, which rests partially on the base conductive bump 138a and partially on the die bond pad 132 of the first semiconductor die. The offset interconnecting conductive bump 138b electrically interconnects the contact pad 109 with the die bond pad 132 of the first semiconductor die. In embodiments, the base conductive bump 138a and the offset interconnecting bump 138b are the same size. However, it is conceivable that the base conductive bump 138a be larger than the offset interconnecting bump 138a, or vice-versa, in further embodiments.

The amount by which the wire bond capillary shifts toward to the first die to deposit the offset interconnecting conductive bump 138b depends at least on the diameter of the offset interconnecting conductive bump 138b and the spacing between the base conductive bump 138a and the first semiconductor die 124. In embodiments, the offset interconnecting conductive bump 138b and the base conductive bump 138a may have a diameter of approximately 30 to 70 µm, and more particularly about 50 µm, though the diameter of the offset interconnecting conductive bump 138b and/or base conductive bump may be greater or smaller than that in further embodiments. The base conductive bump 138a may be spaced 20 µm from the next adjacent semiconductor die. Thus, in one example, after depositing the base conductive bump 138a, the wire bond capillary may shift toward the die stack 35 µm. In this example, a 50 µm-diameter offset interconnecting conductive bump 138b may have 15 µm on the base conductive bump 138a and 15 µm on the die bond pad 132 of the next level. It is understood that all of these dimensions are by way of example, and each may vary in further embodiments.

In the embodiment shown in FIGS. 7 and 8, the height of the base conductive bump 138a is at least approximately the same height as the adjacent semiconductor die 124 (including DAF layer). However, it is understood that the height of the base conductive bump 138a may be higher or lower than the height of the semiconductor die (including DAF layer). In such an embodiment, the offset interconnecting conductive bump 138b may still be applied onto both the base conductive bump 138a and the die bond pad 132 of the adjacent die, to form the electrical interconnection, even though the upper surfaces of the base conductive bump 138a and the die bond pad 132 are not even with each other. In embodiments, the surface of the die bond pad 132 may be as much as 50% higher or lower than the height of the base conductive bump 138a, though this difference may be less than 50% in further embodiments.

In order to electrically interconnect the second semiconductor die 124 in stack 120 with the first semiconductor die (along the first vertical column of die bond pads), a base conductive bump 138a is next applied by the wire bond capillary to the die bond pad 132 of the first semiconductor die. This base conductive bump 138a is placed on the die bond pad 132 next to the existing offset interconnecting conductive bump 138b. The next interconnecting conductive bump 138b is then applied to interconnect the corresponding die bond pads 132 of the first and second semiconductor die. This process is continued vertically up the die stack 120 until all die bond pads 132 in a vertical column of die bond pads are electrically interconnected by base conductive bumps 138a and offset interconnecting conductive bumps 138b. As noted above, instead of constructing vertical columns of conductive bumps 138, the conductive bumps may instead be applied to all contact pads 109/die bond pads 132 on a given level before moving up to the next level.

In the embodiment of FIGS. 7 and 8, the conductive bumps 138 are smaller than the die bond pads 132. However, in further embodiments, conductive bumps 138 may be larger than the die bond pads 132 or at least approximately the same size as the die bond pads 132. Such an embodiment is shown in the side view of FIG. 9. In such an embodiment, a first conductive bump 138 may be applied to a contact pad 109. In this embodiment, the height of the conductive bumps 138 are at least approximately equal to the height of the semiconductor die 124 (including DAF layer) in the die stack 120, e.g., about 25 µm. A second conductive bump 138 may then be applied on a die bond pad 132 of the first semiconductor die in the stack 120.

Having a larger diameter than the die bond pad 132, the second conductive bump rests partially on the first conductive bump applied to the contact pad 109, thus electrically interconnecting the die bond pad on the first semiconductor die 124 in the stack 120 with the contact pad 109. In one example, the die bond pad may be 45 µm long, and the conductive bumps may have a 50 µm diameter. After depositing the base conductive bump 138a, the wire bond capillary may shift toward the die stack 35 µm. In this example, a 50 µm-diameter offset interconnecting conductive bump 138b may have 15 µm on the base conductive bump 138a and 15 µm on the die bond pad 132 of the next level. It is understood that all of these dimensions are by way of example, and each may vary in further embodiments. Subsequent conductive bumps are applied up a vertical column of die bond pads 132 in a similar manner to electrically interconnect all die bond pads 132 in the vertical column. Additional vertical columns may subsequently electrically interconnected with conductive bumps in a similar manner.

In the above-described embodiments, the height of the conductive bumps 138 are at least approximately equal to the height of the semiconductor die 124. However, in further embodiments, the height of a conductive bump 138 may be less than the height of the semiconductor die 124. Such an embodiment is shown in the side view of FIG. 10. Here, base conductive bumps 138a are applied by the wire bond capillary vertically on top of each other to build a pillar of base conductive bumps 138a. The base conductive bumps 138a are applied to the pillar until the height of the pillar is at least approximately equal to the height of the next adjacent semiconductor die 124. Thereafter, an offset interconnecting conductive bump 138b may be applied as described above partially on the uppermost base conductive bump 138a in the pillar and partially on the die bond pad of the next adjacent level of semiconductor die.

The number of base conductive bumps 138a in a pillar may for example be between two and four, though there may be more in further embodiments. Each base conductive bump 138a may be formed for example by stud bumping as explained above, i.e., by forming a ball at the tip of a wire within a wire bond capillary by EFO, and then affixing the bump 138a on the bond pad 132 or a lower base conductive bump 138a. The wire bond capillary may form a first base conductive bump 138a on a pad 109 or 132, pull away, form a second base conductive bump 138a on the first, and so on until the pillar of bumps 138a is completed. Alternatively, the wire bond capillary may deposit a first bump 138a on each pad 109, 132 horizontally across a level, then deposit a second bump 138a on the first bump on each pad, and so on until all the bump pillars are completed.

In embodiments, the pillar of base conductive bumps 138a are stacked and remain as separate, distinct bumps. However, it is conceivable that the pillar of base conductive bumps melt together to form a single large bump having the height of the pillar of bumps. Similarly, the one or more base conductive bumps 138a and offset interconnecting bumps 138b remain as separate, distinct bumps. However, it is conceivable that the one or more base conductive bumps and offset interconnecting conductive bump melt together to form a single bump having the profile of the separate and offset base conductive bumps and offset interconnecting bumps.

In embodiments described above, one or more base conductive bumps 138a and an offset interconnection conductive bump 138b are formed of gold or a gold alloy in a stud bumping process. In further embodiments, one or more of the conductive bumps 138a and/or 138b may be formed of another metal, such as for example copper or solder. Additionally, instead of being formed by a wire bond capillary after the semiconductor die stack 120 is formed, at least some of the base conductive bumps 138a may be formed on the die bond pads 132 during formation of the semiconductor die 124 when still part of a semiconductor wafer.

Following electrical connection of the die 124 with each other and the substrate 102 by the conductive bumps 138, the semiconductor device 100 may be encapsulated in a mold compound 142 in a step 234 and as shown in FIG. 11. The semiconductor device may be placed within a mold chase (not shown) comprising upper and lower mold plates. Molten mold compound 142 may then be injected into the mold chase to encase the components of the semiconductor device 100 in a protective enclosure in for example a compression molding process. Mold compound 142 may include for example solid epoxy resin, Phenol resin, fused silica, crystalline silica, carbon black and/or metal hydroxide. Such mold compounds are available for example from Sumitomo Corp. and Kyocera Corp., both having headquarters in Japan. Other mold compounds from other manufacturers are contemplated. The mold compound may be applied according to other known processes, including by FFT (flow free thin) molding, transfer molding or injection molding techniques.

In embodiments where the semiconductor device 100 is to be permanently affixed to a host device such as a printed circuit board, solder balls 144 (FIG. 11) may be affixed to the contact pads 108 on a lower surface of substrate 102 of the device 100 in step 236. The solder balls 144 may be omitted in embodiments where the semiconductor device 100 is to be used as an LGA (land grid array) semiconductor package.

As noted above, the semiconductor device 100 may be formed on a panel of substrates. After formation and encapsulation of the devices 100, the devices 100 may be singulated from each other in step 240 to form a finished semiconductor device 100 as shown in FIG. 11. The semiconductor devices 100 may be singulated by any of a variety of cutting methods including sawing, water jet cutting, laser cutting, water guided laser cutting, dry media cutting, and diamond coating wire cutting. While straight line cuts will define generally rectangular or square shaped semiconductor devices 100, it is understood that semiconductor device 100 may have shapes other than rectangular and square in further embodiments of the present technology.

Figure 12:
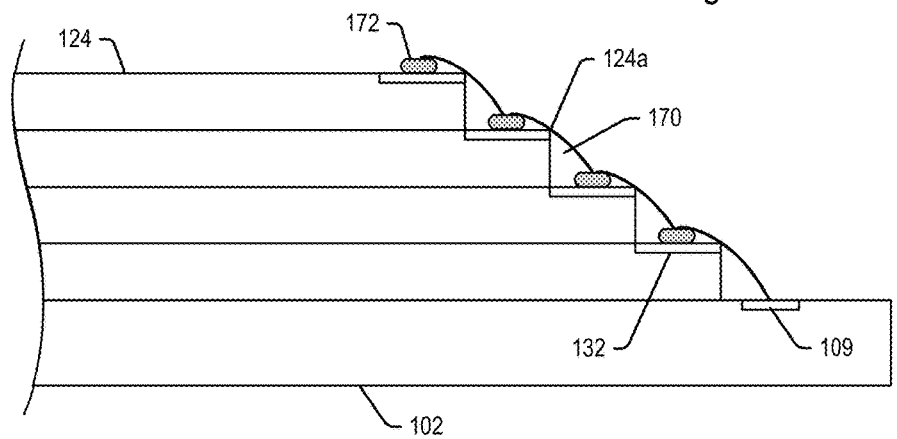
FIGS. 12 and 13 are side and perspective views of a semiconductor device where the semiconductor die in the die stack are electrically interconnected with low height wire bonds according to an alternative embodiment of the present technology.
Figure 13:
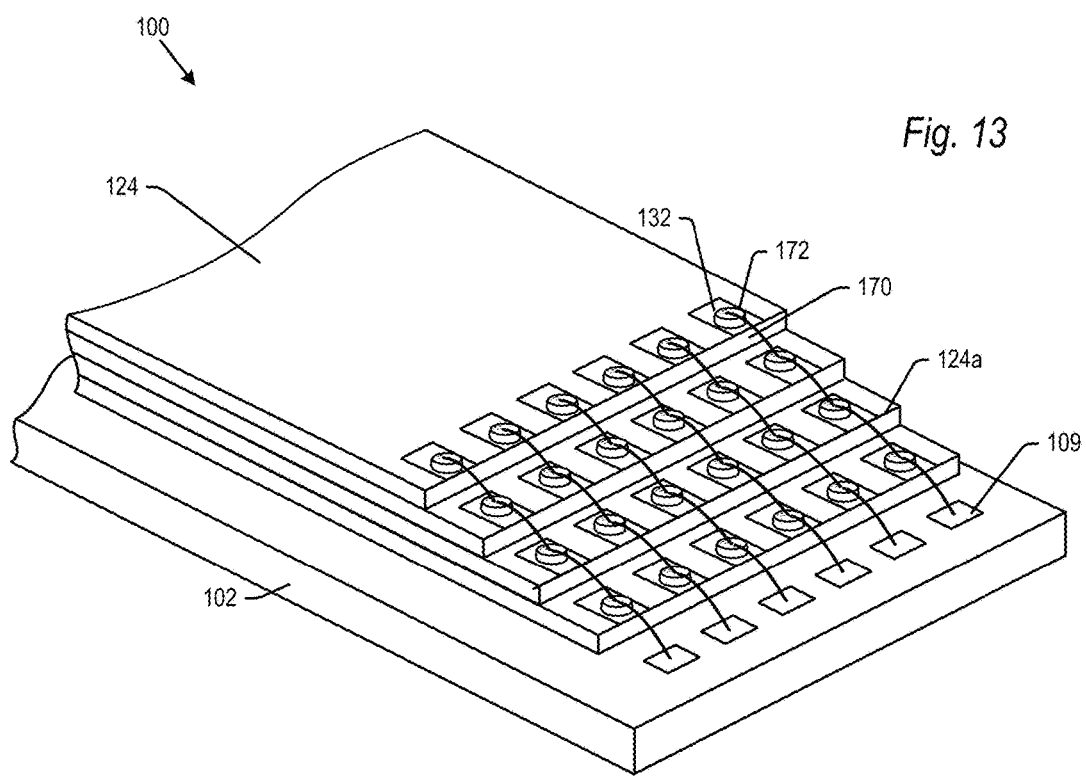

In embodiments described above, the electrical interconnections are formed using conductive bumps. In a further embodiment, the electrical interconnections may be formed using low-height wire bonds. Such an embodiment is shown in FIGS. 12 and 13. The low-height wire bonds, referred to herein as "zero wire loop height" bonds 170 use the shortest wire length to connect between die 124 to die 124, and die to contact pad 109 of substrate 102. The wire bonds 170 may be formed using a wire bond capillary (not shown).

Although wire bonds 170 may be formed by a variety of technologies, in one embodiment, the wire bonds 170 may be formed as ball bonds. A stud bump 172 may be formed on a die bond pad 132 of an uppermost semiconductor die in stack 120. Thereafter, the wire bond capillary may pay out wire while moving to the corresponding die bond pad 132 of the next lower level die. The capillary may then apply pressure, heat and ultrasonic energy to break off the wire and leave it stitched to the bond pad on the lower level die. The wire bond capillary may then form the next stud bump on top of the stitch bond and repeat to form a vertical line of wire bonds down the die stack and to the corresponding contact pad 109 on substrate 102. The wire bonds 170 may be formed by other technologies in further embodiments.

As the wire is pulled from a first level to the next lower level, it may rest against the edge 124a of the semiconductor die on the first level. This may be true for each wire bond 170 formed between each level of semiconductor die 124. This minimizes wire height and prevents wire sweep which can cause electrical noise and possibly electrical shorting.

In summary, in one example, the present technology relates to a semiconductor device, comprising: a substrate; a plurality of semiconductor die, each semiconductor die of the plurality of semiconductor die comprising a plurality of die bond pads along an edge of the semiconductor die, the plurality of semiconductor die forming a die stack of semiconductor die stacked with respect to each other in a stepped offset pattern, the stepped offset pattern exposing the plurality of die bond pads in each semiconductor die; and a plurality of conductive bumps electrically interconnecting the die bond pads of semiconductor die on different levels of the die stack.

In a further example, the present technology relates to a semiconductor device, comprising: a substrate; a plurality of semiconductor die, each semiconductor die of the plurality of semiconductor die comprising: a first surface, a second surface opposite the first surface, and a plurality of die bond pads along an edge of the semiconductor die, on the first surface of the semiconductor die, the plurality of semiconductor die stacked with respect to each other in a stepped offset pattern to form a die stack, the first surface of a first semiconductor die mounted to the second surface of a second semiconductor die in an adjacent level of the stack, the stepped offset pattern exposing the plurality of die bond pads in each semiconductor die; a plurality of solder bumps stacked on each other and electrically interconnecting the die bond pads of the first and second semiconductor die in the die stack.

In another example, the present technology relates to a semiconductor device, comprising: a substrate; a plurality of semiconductor die, each semiconductor die of the plurality of semiconductor die comprising a plurality of die bond pads along an edge of the semiconductor die, the plurality of semiconductor die forming a die stack of multiple levels of semiconductor die stacked with respect to each other in a stepped offset pattern, the stepped offset pattern exposing the plurality of die bond pads in each semiconductor die, die bond pads aligned with each other in different levels forming a vertical die bond path; and a plurality of conductive bumps formed on the die bond pads, one or more conductive bumps of the plurality of conductive bumps electrically interconnecting die bond pads in adjacent levels of the vertical die bond path, and a die bond pad electrically interconnecting a pair of conductive bumps mounted on the die bond pad.

In a further example, the present technology relates to a semiconductor device, comprising: substrate means; a plurality of semiconductor die, each semiconductor die of the plurality of semiconductor die comprising pad means along an edge of the semiconductor die, the plurality of semiconductor die forming a die stack of semiconductor die stacked with respect to each other in a stepped offset pattern, the stepped offset pattern exposing the pad means in each semiconductor die; and bump means electrically interconnecting the pad means of semiconductor die on different levels of the die stack.

As also noted above, in embodiments, the present technology may relate to a semiconductor device having zero wire loop height bond wires. Such an embodiment may include a substrate; a plurality of semiconductor die, each semiconductor die of the plurality of semiconductor die comprising a plurality of die bond pads along an edge of the semiconductor die, the plurality of semiconductor die forming a die stack of semiconductor die stacked with respect to each other in a stepped offset pattern, the stepped offset pattern exposing the plurality of die bond pads in each semiconductor die; and a plurality of wire bonds electrically interconnecting the die bond pads of semiconductor die on different levels of the die stack, the wire bonds contacting the edge of the semiconductor die.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims appended hereto.

We claim:

1. A semiconductor device, comprising:
   a substrate;
   a plurality of semiconductor die, each semiconductor die of the plurality of semiconductor die comprising a plurality of die bond pads, the plurality of semiconductor die forming a die stack of semiconductor die stacked with respect to each other in a stepped offset pattern, the stepped offset pattern exposing the plurality of die bond pads in each semiconductor die; and a plurality of conductive bumps by themselves electrically interconnecting the die bond pads of semiconductor die on different levels of the die stack;

wherein the plurality of conductive bumps comprise one or more base conductive bumps on a first die bond pad of the plurality of die bond pads, and an offset interconnecting conductive bump formed on top of the one or more base conductive bumps and offset with respect to the one or more base conductive bumps.

2. The semiconductor device of claim 1, wherein the offset interconnecting conductive bump is formed partially on top of the one or more base conductive bumps and partially on a second die bond pad vertically aligned with the first die bond pad in the die stack.

3. The semiconductor device of claim 1, wherein the one or more base conductive bumps comprise a single base conductive bump.

4. The semiconductor device of claim 3, wherein the single base conductive bump has a height at least approximately equal to a height of a semiconductor die in the die stack of semiconductor die.

5. The semiconductor device of claim 1, wherein the one or more base conductive bumps comprise a plurality of base conductive bumps stacked into a vertical pillar.

6. The semiconductor device of claim 5, wherein the plurality of base conductive bumps have a cumulative height at least approximately equal to a height of a semiconductor die in the die stack of semiconductor die.

7. The semiconductor device of claim 1, wherein the plurality of semiconductor die are flash memory semiconductor die.

8. A semiconductor device, comprising:
a substrate;
a plurality of semiconductor die, each semiconductor die of the plurality of semiconductor die comprising:
 a first surface,
 a second surface opposite the first surface, and
 a plurality of die bond pads on the first surface of the semiconductor die;
the plurality of semiconductor die stacked with respect to each other in a stepped offset pattern to form a die stack, the first surface of a first semiconductor die mounted to the second surface of a second semiconductor die in adjacent levels of the stack, the stepped offset pattern exposing the plurality of die bond pads in each semiconductor die;
a plurality of conductive bumps stacked on each other and physically and electrically interconnecting the die bond pads of the first and second semiconductor die in the die stack;
wherein the plurality of conductive bumps comprise one or more base conductive bumps and an offset interconnecting conductive bump, the one or more base conductive bumps comprising a first base conductive bump physically affixed to a die bond pad of the second semiconductor die, the offset interconnecting conductive bump having a first portion physically affixed to a base conductive bump and a second portion physically affixed to a die bond pad of the first semiconductor die.

9. The semiconductor device of claim 8, wherein the plurality of conductive bumps comprise first and second conductive bumps stacked on a die bond pad of the second semiconductor die, the first and second conductive bumps stacked in an offset relation to each other.

10. The semiconductor device of claim 8, wherein the one or more base conductive bumps comprise a plurality of base conductive bumps stacked into a vertical pillar on the die bond pad of the second semiconductor die.

11. The semiconductor device of claim 10, wherein the plurality of base conductive bumps have a cumulative height at least approximately equal to a height of the first semiconductor die.

12. The semiconductor device of claim 11, wherein the height of the first semiconductor die includes the thickness of the semiconductor die plus a layer of die attach film on the first surface of the first semiconductor die.

13. A semiconductor device, comprising:
a substrate;
a plurality of semiconductor die, each semiconductor die of the plurality of semiconductor die comprising a plurality of die bond pads, the plurality of semiconductor die forming a die stack of multiple levels of semiconductor die stacked with respect to each other in a stepped offset pattern, the stepped offset pattern exposing the plurality of die bond pads in each semiconductor die; and
a plurality of conductive bumps formed on the die bond pads, the plurality of conductive bumps comprising one or more base conductive bumps on a first die bond pad of a first semiconductor die, and the plurality of conductive bumps comprising an interconnecting conductive bump formed on top of the one or more base conductive bumps and offset with respect to the one or more base conductive bumps.

14. The semiconductor device of claim 13, wherein the one or more base conductive bumps comprise a plurality of base conductive bumps stacked into a vertical pillar on the first die bond pad.

15. The semiconductor device of claim 13, wherein the offset interconnecting conductive bump comprises a first portion partially on top of the one or more base conductive bumps and a second portion partially mounted on a second die bond pad vertically aligned with the first die bond pad in the die stack.

16. The semiconductor device of claim 15, wherein the one or more base conductive bumps comprise a first group of one or more base conductive bumps, the semiconductor device further comprising a second group of one or more base conductive bumps mounted on the first die bond pad in addition to the first portion of the offset interconnecting conductive bump.

17. A semiconductor device, comprising:
a substrate;
a plurality of semiconductor die, each semiconductor die of the plurality of semiconductor die comprising a plurality of die bond pads, the plurality of semiconductor die forming a die stack of semiconductor die stacked with respect to each other in a stepped offset pattern, the stepped offset pattern exposing the plurality of die bond pads in each semiconductor die; and
a plurality of conductive bumps electrically interconnecting the die bond pads of semiconductor die on different levels of the die stack;
wherein the plurality of conductive bumps comprise one or more base conductive bumps on a first die bond pad of the plurality of die bond pads, and an offset interconnecting conductive bump formed on top of the one or more base conductive bumps and offset with respect to the one or more base conductive bumps.

18. The semiconductor device of claim 17, wherein the offset interconnecting conductive bump is formed partially on top of the one or more base conductive bumps and partially on a second die bond pad vertically aligned with the first die bond pad in the die stack.

19. The semiconductor device of claim 17 wherein the one or more base conductive bumps comprise a single base conductive bump.

20. The semiconductor device of claim 19, wherein the single base conductive bump has a height at least approximately equal to a height of a semiconductor die in the die stack of semiconductor die.

21. The semiconductor device of claim 17, wherein the one or more base conductive bumps comprise a plurality of base conductive bumps stacked into a vertical pillar.

22. The semiconductor device of claim 21, wherein the plurality of base conductive bumps have a cumulative height at least approximately equal to a height of a semiconductor die in the die stack of semiconductor die.

* * * * *